(12) United States Patent
Hsieh

(10) Patent No.: US 6,818,512 B1
(45) Date of Patent: Nov. 16, 2004

(54) SPLIT-GATE FLASH WITH SOURCE/DRAIN MULTI-SHARING

(75) Inventor: Chia-Ta Hsieh, Tainan (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/037,577

(22) Filed: Jan. 4, 2002

(51) Int. Cl.[7] .................................. H01L 21/336
(52) U.S. Cl. .................. 438/267; 438/257; 438/258; 438/264; 438/265; 438/266; 257/314; 257/315; 257/316
(58) Field of Search .................. 438/257, 258, 438/264–267; 257/314–316, 319, 326

(56) References Cited

U.S. PATENT DOCUMENTS

| | | | |
|---|---|---|---|
| 5,278,439 A | * | 1/1994 | Ma et al. |
| 5,364,806 A | * | 11/1994 | Ma et al. .................. 438/266 |
| 5,677,872 A | * | 10/1997 | Samachisa et al. .... 365/185.14 |
| 5,712,179 A | * | 1/1998 | Yuan .......................... 438/588 |
| 5,895,949 A | * | 4/1999 | Endoh ........................ 257/314 |
| 6,028,336 A | * | 2/2000 | Yuan .......................... 257/315 |
| 6,091,633 A | * | 7/2000 | Cernea et al. ......... 365/185.13 |
| 6,133,098 A | * | 10/2000 | Ogura et al. ............... 438/267 |
| 6,151,248 A | * | 11/2000 | Harari et al. ........... 365/185.14 |
| 6,222,762 B1 | * | 4/2001 | Guterman et al. ..... 365/185.03 |
| 6,503,785 B2 | * | 1/2003 | Chen ........................... 438/211 |
| 6,638,821 B1 | * | 10/2003 | Hsieh .......................... 438/257 |
| 6,645,813 B1 | * | 11/2003 | Hsieh .......................... 438/257 |
| 6,686,632 B2 | * | 2/2004 | Ogura et al. ............... 257/374 |

OTHER PUBLICATIONS

Ma et al., A dual–bit split–gate EEPROM (DSG) cell in contactless array for single–Vcc high density flash memories, *IEEE IEDM* (Dec. 1994), 57–60.*

* cited by examiner

*Primary Examiner*—Richard Elms
*Assistant Examiner*—Christian D. Wilson
(74) *Attorney, Agent, or Firm*—George O. Saile; Stephen B. Ackerman

(57) ABSTRACT

A multi-bit split-gate (MSG) flash cell with multi-shared source/drain and making of the same are disclosed. The MSG is formed with N+1 stacked gates comprising floating gates and control gates, separated by N select gates, all sharing the same source/drain between a pair of bit lines. With the disclosed MSG, a multiplicity of N+1 bit programming can be accomplished bit by bit where the programmed bits are selected by word line, bit line and control gate. In the erase operation, erased bits are selected by word line, while in the read operation, operations similar to write operation are performed. Thus, it is disclosed here that a plurality of N+1 bits or cells, where N is any integer, can be formed between two bit lines and along the same word line.

10 Claims, 12 Drawing Sheets

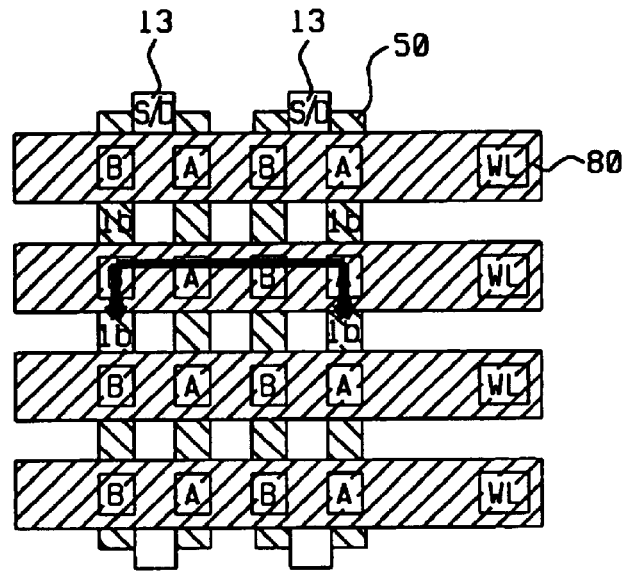
FIG. 1a – Prior Art
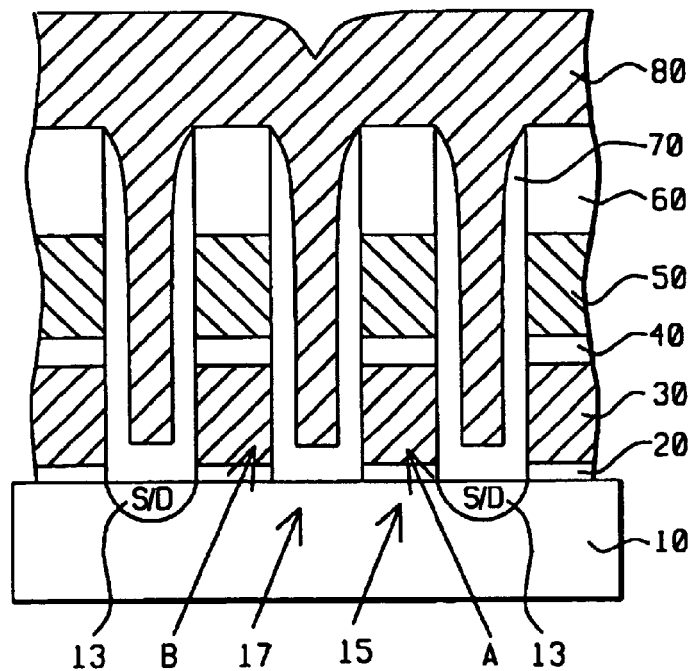
FIG. 1b – Prior Art

```
Table of Keys to Figures
D  : drain as BIT LINE
S  : source
CG : control gate
SG : selected gate as WORD LINE
TG : transfer gate
    ▦  : seleceted cell
    ▧  : un-selected cell
```
*FIG. 1c - Prior Art*
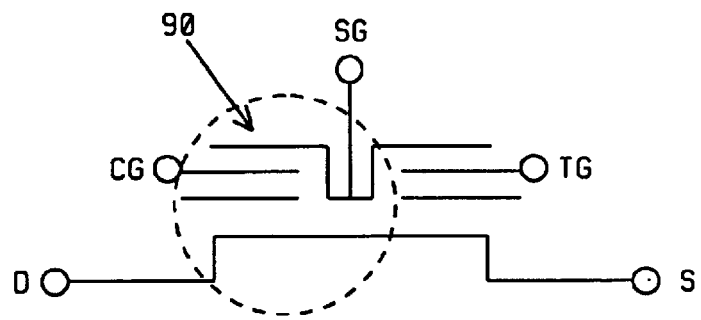
*FIG. 1d - Prior Art*
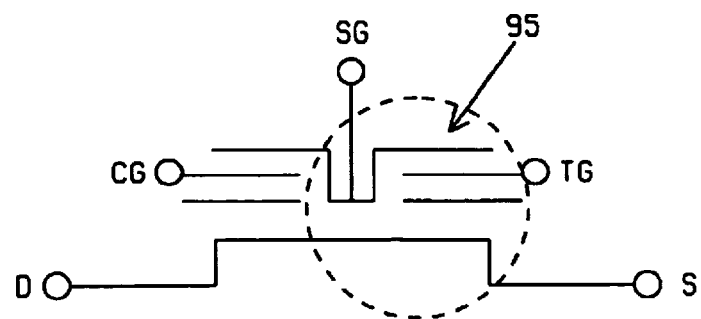
*FIG. 1e - Prior Art*

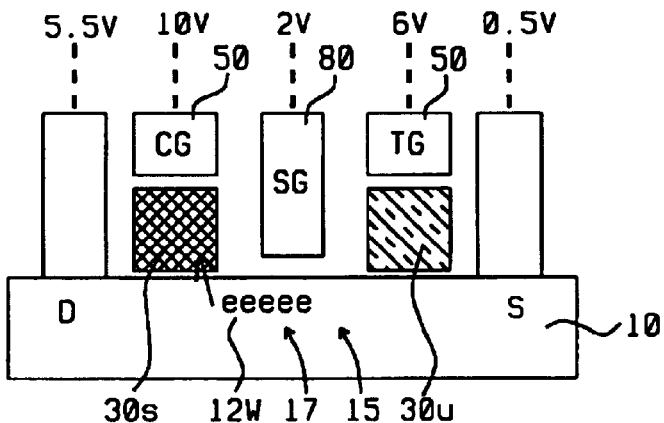
*FIG. 2a - Prior Art*
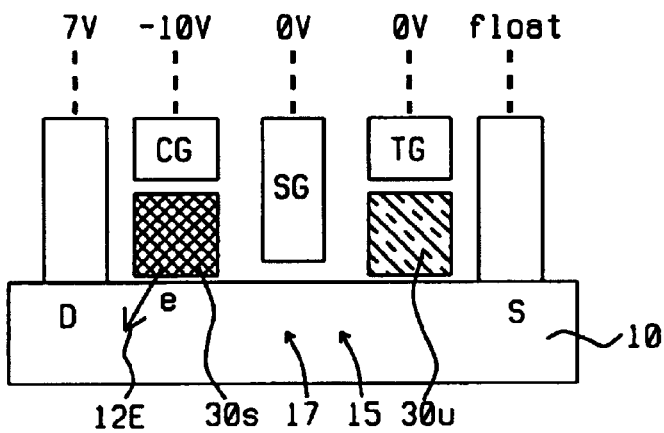
*FIG. 2b - Prior Art*
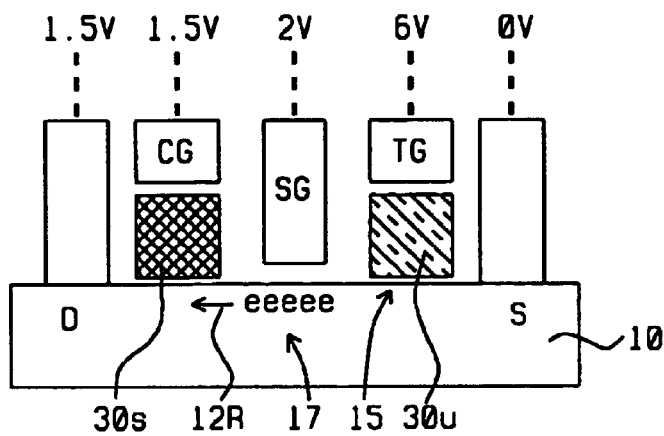
*FIG. 2c - Prior Art*

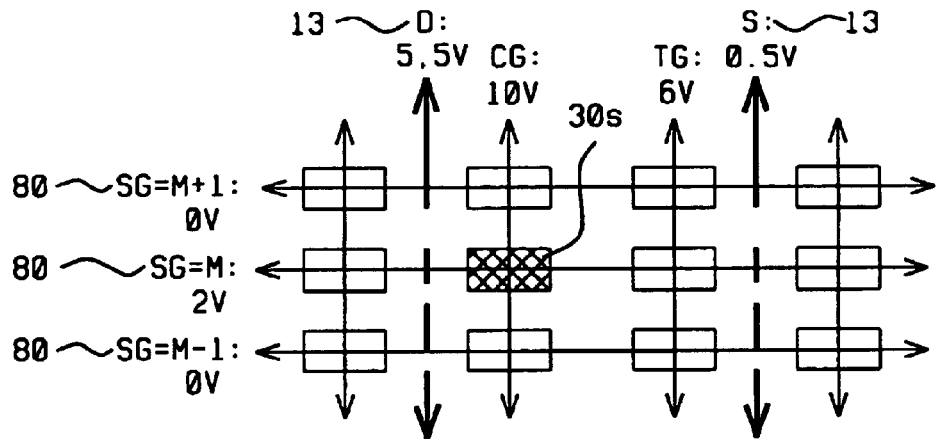
*FIG. 3a - Prior Art*
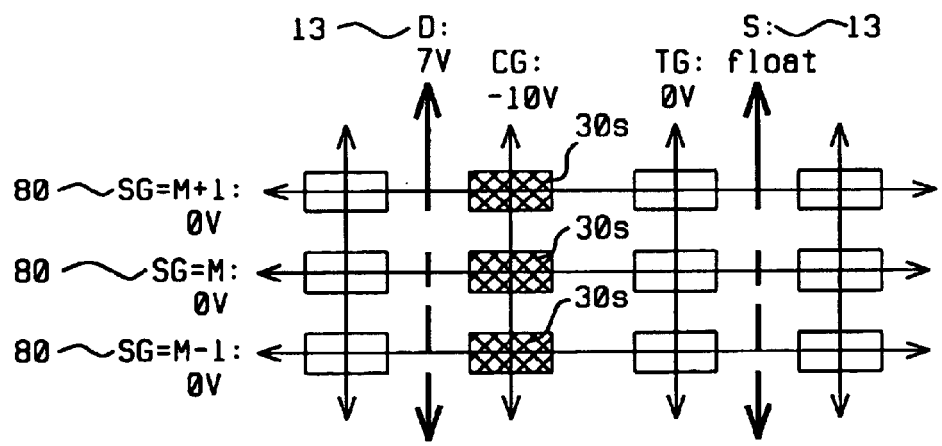
*FIG. 3b - Prior Art*
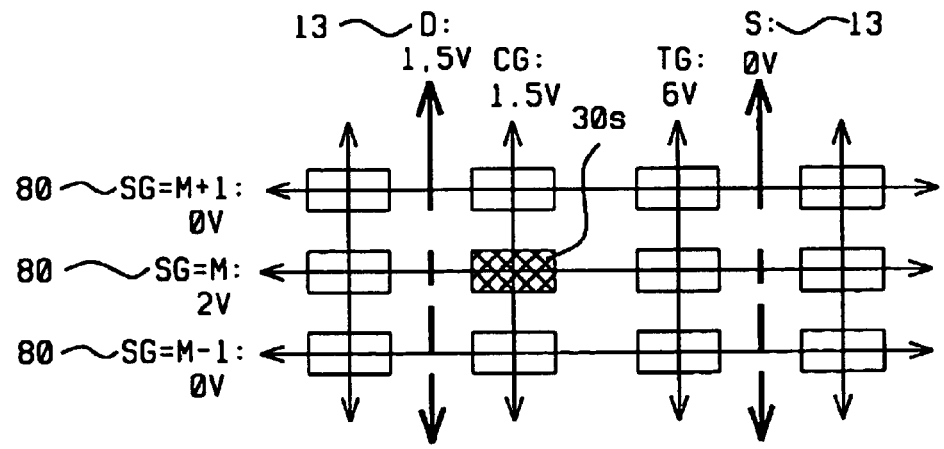
*FIG. 3c - Prior Art*

SPLIT-GATE FLASH WITH SOURCE/DRAIN MULTI-SHARING

This application is related to application, "A Flash EEPROM with Function of Single Bit Erasing by an Application of Negative Control Gate Selection," Ser. No. 10/043,726, and Filing Date: Jan. 10, 2002; and to application, "A Flash EEPROM with Function Bit by Bit Erasing," Ser. No. 10/686,794, and Filing Date: Oct. 16, 2003.

BACKGROUND OF THE INVENTION (1) Field of the Invention

The present invention relates to the manufacture of semiconductor devices, and in particular, to split-gate flash memory cells and to a method of forming high density flash memory arrays using the same.

(2) Description of the Related Art

Various techniques of forming memory cells have been used in the semiconductor manufacturing industry to increase the density of flash memory arrays. One such technique is to share the source and drain regions interchangeably between adjacent cells on the same word line of a split-gate flash memory. For example, in the dual split-gate (DSG) shown in FIG. 1a, two floating gates of the cells (A) and (B) share the same source/drain(S/D). More specifically, and as seen more clearly in the cross-sectional view (1b) of the same substrate (10), the memory cell is a triple polysilicon split-gate structure in which the floating gate (30) above gate-oxide (20) is polysilicon level 1, control gate (50), separated from the floating gate by inter-gate oxide (40), is polysilicon level 2, and the word select gate (80), separated from the control gate by nitride layer (60) is: polysilicon level 3. It will be noted that third polysilicon (80) is isolated from both the floating gate and control gate by oxide spacer (70) as shown in the same Figure. Source/drain diffusions (13) are placed every two floating gates apart, thus improving density over the conventional cell, which has separated source and drain regions. Although two floating gates share the same word gate, source and drain regions, read and/or program to a single floating gate is possible because control gates are separated. Above each of the floating gates lies a control gate which controls the voltage of the individual floating gate by capacitance coupling. The control lines run parallel to the source/drain. Some of the disadvantages of the DSG cell are high program voltages of about 12V and also high voltages during read. A high control gate voltage of 12V is required during read operation when one of the floating gates is being accessed in order to mask out the effects from the other floating gate. Adjacent cells which may share the same diffusion or control gate voltages will be effectively disabled from the operation by suppressing the other floating gates with a very low ~0 control gate voltage. The same kind of over-ride and suppress techniques are used during program in order to target a single floating gate cell. In this way, program and read operations can be performed on the high density, self-aligned dual-bit split-gate flash/EEPROM cell.

As described more in detail by Y. Ma, et al., in U.S. Pat. No. 5,278,439 the DSG shown in FIGS. 1a and 1b contains two bits, A and B, one in each cell. This can be better understood by considering FIGS. 1d and 1e with the key shown in FIG. 1c. (See also, Y. Ma paper on "A Dual-bit split-Gate EEPROM (DSG) Cell in Contactless Array for single-Vcc Height Density Flash Memories"). The cell has two floating gates, one control-gate (CG), one transfer-gate (TG), one common selected gate (SG), and the two bits share one pair of drain (D) and source (S). As shown in FIG. 1b, the CG and TG are structurally identical. The SG channel is formed by a split-gate located between CG and TG. The dual-bit cell is accessed by five terminals, as shown in FIGS. 1d and 1e. The conventions of the five active terminals are referred to as the left (90) or right (95) selected bit in the cell, as indicated in the same Figures. It will be apparent to those skilled in the art that in comparison with a conventional single-bit cell, the DSG's cell size savings comes directly from the shared and self-aligned SG. Of the three directly connected channels (CG, SG, and TG) between the source and drain, two work as a transfer channel (17), one as control-channel (15) for the selected channel, as shown in FIG. 1b. During an address switch between the left and right bits in the cell, the CG and TG terminals exchange their functions, so do the terminals of drain and source. Within a cell, the two bits are reciprocally equal.

The various program (write), erase and read operations for a DSG are illustrated in FIGS. 2a-2c and 3a-3c. FIGS. 2a-2c schematically represent the cross-sectional views of a DSG while FIGS. 3a-3c represent a top view of the same DSG where Figure numbers with the suffixes (a), (b) and (c) refer to the write, erase and read operations, respectively. The key shown in FIG. 1c also apply to FIGS. 2a-2c and 3a-3c so that the five terminals shown in FIGS. 2a-2c would be impressed with voltage (V) appropriate to the particular gate corresponding to each one of the operations.

Thus, keeping the same reference numerals in FIGS. 1a-1e referring to similar parts throughout the several views in FIGS. 2a-2c and 3a-3c, FIGS. 2a and 3a show the program or write operation for the same DSG as before. The write operation is performed bit by bit and the programmed bit is selected by a selected gate or word line (80) and bit line (13). In the write operation, source-side-injection mechanism is used where the selected gate (SG) is only weakly turned on so as to just turn on channel of unselected cell (30u) while a higher voltage is used on control gate (CG) to provide higher vertical electric field to complete the write operation. In other words, hot-electrons (12W) are created at the transitional channel region (17) between SG and CG, and injected to the source side of the floating gate (30s) while TG and CG are strongly turned on. The various voltage levels are shown for the program operation in both FIGS. 2a and 3a.

In the erase operation shown in FIGS. 2b and 3b, negative-gate Fowler-Nordheim tunneling is used. Thus, during erase, with negative voltage of −10V on CG, an applied drain voltage of 7V pulls the stored electrons out of floating gate (30s) via drain-side tunneling (12E), while the SG is grounded and the conduction channel cut off. As seen in FIG. 3b, erased bits (30s) are selected only by CG and a whole page of bits in the array are erased.

The read operation is accomplished by selecting the read bit by word line (80) and bit line (13) as in the write operation except that the TG and SG are fully turned on and the stored information is sensed by detecting whether the is channel current (12R) under the grounded CG.

In prior art there are other schemes for forming triple polysilicon flash EEPROM arrays with dual-bit capabilities. In U.S. Pat. Nos. 6,028,336 and 5,712,179 by Yuan, a triple polysilicon flash EEPROM array having a separate erase gate for each row of floating gates, and methods of manufacturing such an array are disclosed. As part of a flash EEPROM array on a semiconductor substrate, erase gates are formed in individual trenches between rows of floating gates. The erase gate is positioned along one sidewall of the trench in a manner to be capacitively coupled with the floating gates of one of the rows adjacent the trench but spaced apart from the floating gates of the other row adjacent the trench. In this way, a separate erase gate is provided for each row of floating gates without increasing the size of the array. The erasure of each row is then individually controlled. Two self-aligned methods of forming such an array are disclosed. One method involves forming a thick insulating layer along one sidewall of the trench and then filling a remaining space adjacent an opposite trench sidewall with polysilicon material forming an erase gate for the row of floating gates adjacent the other sidewall. A second method involves anisotropically etching a layer of polysilicon that is formed over the array in a manner to conform to the trench sidewalls, thereby separating the polysilicon layer into individual erase gates carried by the trench sidewalls.

In U.S. Pat. No. 6,13,098, a process for making and programming and operating a dual-bit multi-level ballistic flash memory is disclosed by S. Ogura. Here, two side wall floating gates are paired with a single word line select gate, and word lines are arranged to be perpendicular both the bit lines and control gate lines. Two adjacent memory cells on the same word line do not require an isolation region. Adjacent memory cells on the same word line share bitline diffusion as well as a third poly control gate. Control gates allow program and read access to the individual floating gate. In one embodiment, the dual multi-level structure is applied to the ballistic step split gate side wall transistor. In a second embodiment, the dual multi-level structure is applied to the ballistic planar split gate side wall transistor. Both types of ballistic transistors provide fast, low voltage programming. The control gates are used to override or suppress the various threshold voltages on associated floating gates, in order to program to and read from individual floating gates.

In still another dual floating gate EEPROM cell array, with steering gates that are shared by adjacent cells, E. Harari, et al., show in U.S. Pat. No. 6,151,248 how dual gate cells can increase the density of data stored. An EEPROM system has an array of memory cells that individually include two floating gates, bit line source and drain diffusions extending along columns, steering gates also extending along columns and select gates forming word lines along rows of floating gates. The dual gate cell increases the density of data that can be stored. Rather than providing a separate steering gate for each column of floating gates, an individual steering gate is shared by two adjacent columns of floating gates that have a diffusion between them. The steering gate is thus shared by two floating gates of different but adjacent memory cells. In one array embodiment, the floating gates are formed on the surface of the substrate. In arrays that erase the floating gates to the select gates, rather than to the substrate, the wider steering gates uncouple the diffusions they cover from the select gates. This use of a single steering gate for two floating gates also allows the floating gates, in another embodiment, to be formed on side walls of trenches in the substrate with the common steering gate between them, to further increase the density of data that can be stored. Multiple bits of data are also stored on each floating gate.

Low voltage erase of a flash EEPROM system having a common erase electrode for two individual erasable sectors are shown in U.S. Pat. No. 5,677,872 by G. Samachisa, et al. Here also a flash EEPROM is organized on an integrated circuit with individual erase gates being shared by two adjacent blocks, or sectors, of memory cells. This is to reduce the number of erase gates and the complexity of the driving erase circuitry.

Also, according to Guterman, et al., U.S. Pat. No. 6,222,762 teaches maximized multi-state compaction and more tolerance in memory state behavior through a flexible, self-consistent and self-adapting mode of detection, covering a wide dynamic range. On the other hand, R. A. Cernea disclose in U.S. Pat. No. 6,091,633 a memory array architecture utilizing global bit lines shared by multiple cells. Multiple columns of memory cells are positioned between the global bit lines. Bit selection lines oriented in the column direction are connected to the gates of select transistors within the memory cells. Word line individually extend over one or two rows of floating gates. This arrangement provides a very small array that allows for future scaling.

As useful as dual-bit split-gates (DSG) and multi-state memory cells are, further improvements can be achieved by multi-sharing of source/drain regions in the manner disclosed below in the embodiments of the present invention.

SUMMARY OF THE INVENTION

It is therefore an object of the present invention to provide a multi-bit split-gate (MSG) flash cell with multi-shared source/drain.

It is another object of the present invention to provide a method of forming a multi-bit split-gate (MSG) flash cell with multi-shared source/drain.

It is still another object of the present invention to provide a method of programming a multi-bit split-gate (MSG) flash cell with multi-shared source/drain.

These objects are accomplished by a semiconductor substrate having a surface region of first conductivity type; a first drain region and a second drain region formed in said surface region; a plurality of (N+1) stacked gates separated apart by N select gates (SGs) between said first drain region and said second drain region, where N is any integer; a first bit line contacting said first drain region; a second bit line contacting said second drain region; and a word line contacting said select gate.

The objects of the instant invention are further accomplished by providing a semiconductor substrate having active and passive regions defined; forming a first dielectric layer over said substrate; forming a first polysilicon layer over said first dielectric layer; forming a plurality of floating gates comprising said first polysilicon layer, wherein said plurality of floating gates are spaced apart by a plurality of openings over said first dielectric layer; forming a second dielectric layer over said plurality of floating gates, including said plurality of openings; forming a second polysilicon layer over said second dielectric layer; forming a plurality of control gates comprising said second polysilicon layer over said second dielectric layer over said plurality of floating gates; forming a third dielectric layer over said plurality of control gates; forming a fourth dielectric layer over the inside walls of said plurality of openings; forming a third polysilicon layer over first of said plurality of openings to form a first bit line over said substrate, and over last of said plurality of openings to form a second bit line over said substrate; forming a fifth dielectric layer over said first bit line and over said second bit line; and forming a fourth polysilicon layer over said fifth dielectric layer, including over said plurality of openings, to form a word line contacting select gates on said semiconductor substrate.

Further objects for programming are accomplished by providing a multi-bit flash cell having a pair of source/drain (S/D) bit lines and N'=(1+N) stacked gates comprising floating gates (FGs) and control gates (CGs) spaced apart with N select gates (SGs) between said bit lines, where N equals any integer; exchanging the address of control gates with those of transfer gates (TGs); performing program (write) operation bit by bit, wherein programmed bit is selected by word line, bit line and control gate; performing erase operation, wherein the erased bits are selected by word line, only; and performing read operation.

BRIEF DESCRIPTION OF THE DRAWINGS

FIG. 1a is a top view of a portion of a substrate showing the forming of a dual-bit split-gate (DSG) flash memory cell, according to prior art.

FIG. 1b is a cross-sectional view of the substrate of FIG. 1a showing the forming of a DSG flash memory cell, according to prior art.

FIG. 1c is a Table showing various keys to Figures.

FIG. 1d is a terminal diagram of a DSG showing the left-side bit, according to prior art.

FIG. 1e is a terminal diagram of a DSG showing the right-side bit, according to prior art.

FIG. 2a is a schematic drawing showing the structural state of a DSG flash memory cell after programming (writing) operation, according to prior art.

FIG. 2b is a schematic drawing showing the structural state of a DSG flash memory cell after erase operation, according to prior art.

FIG. 2c is a schematic drawing showing the structural state of a DSG flash memory cell after read operation, according to prior art.

FIG. 3a is a schematic drawing showing the diagrammatic plan view of FIG. 2a, according to prior art.

FIG. 3b is a schematic drawing showing the diagrammatic plan view of FIG. 2b, according to prior art.

FIG. 3c is a schematic drawing showing the diagrammatic plan view of FIG. 2c, according to prior art.

FIGS. 4a-4f are top views of a portion of a substrate showing the forming of a multi-bit split-gate (MSG) flash memory cell of the present invention while

FIG. 5a is a cross-sectional view of a portion of substrate of FIG. 4a showing the forming of a first dielectric layer followed by the forming of a first polysilicon layer, according to the present invention.

FIG. 5b is a cross-sectional view of a portion of substrate of FIG. 4b showing the forming of the stacked gates, each comprising a floating gate and a control gate of the disclosed MSG, according to the present invention.

FIG. 5c is a cross-sectional view of a portion of substrate of FIG. 4c showing the forming of the two source/drain regions of the disclosed MSG, according to the present invention.

FIG. 5d is a cross-sectional view of a portion of substrate of FIG. 4d showing the forming of the two bit lines of the disclosed MSG, according to the present invention.

FIG. 5e is a cross-sectional view of a portion of substrate of FIG. 4e showing the forming of the select gates of the disclosed MSG, according to the present invention.

FIG. 5f is a cross-sectional view of a portion of substrate of FIG. 4f showing the forming of the word line of the disclosed MSG, according to the present invention.

DESCRIPTION OF THE PREFERRED EMBODIMENTS

Figure 4A:
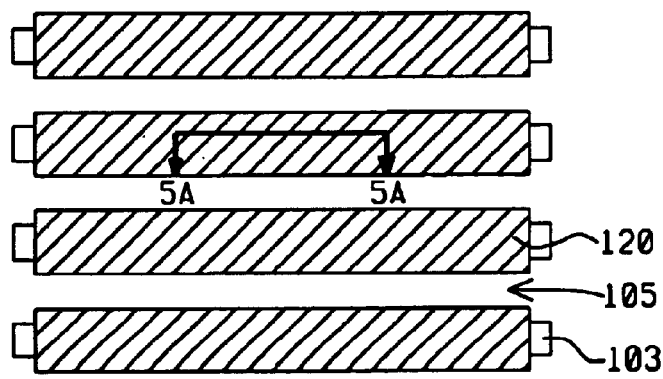
Figure 4B:
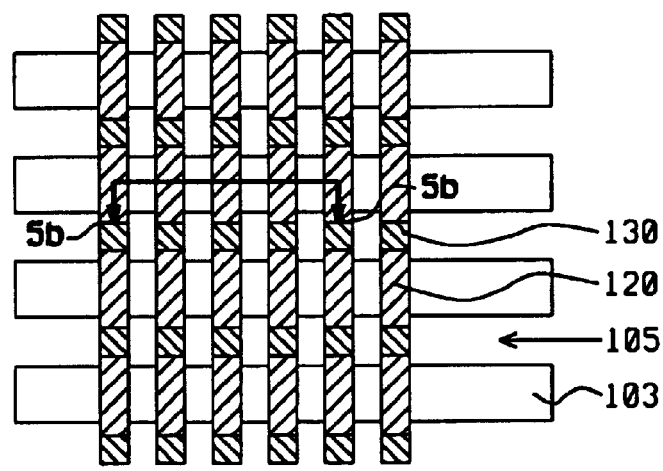

Referring now to the drawings, namely, to FIGS. 4a-4f and 5a-5f first, there is shown steps of forming a split-gate flash memory cell with the capability of being programmed multiple bits in contrast with the capability of the current state of the art of dual bit split-gate flash memory cells. FIGS. 6a-6c and 7a-7c show the writing, erasing and reading of the disclosed multi-bit split-gate flash memory cell.

FIGS. 4a-4f show top views of a portion of a substrate while FIGS. 5a-5f show the cross-sectional views taken at corresponding locations shown on the top views. Thus, in FIG. 4a, top view of a portion of substrate (100) is shown. The substrate is preferably a single-crystal silicon doped with a first conductive type dopant, for example, boron (B). The substrate is provided with a plurality of active and passive field regions, as is known in the art, and are referenced as (103) and (105), respectively. The active regions define cells which are implanted to a threshold voltage $V_t$ utilizing boron (B) ions at a concentration of $5 \times 10^{10}$ to $5 \times 10^{12}$ atoms/cm$^2$ and at an energy level between about 40 to 60 KeV, and the diffusion regions are self-aligned to polysilicon strips (120) to be formed later as described below.

Figure 5A:
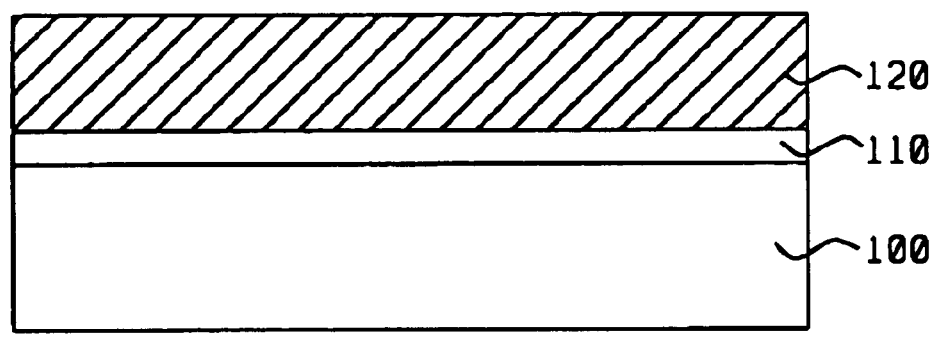
FIGS. 5a-5f are the cross-sectional views taken at the corresponding cuts shown on FIGS. 4a-4f as described below.

As shown in the cross-sectional view of FIG. 4a, namely, in FIG. 5a, a first dielectric layer (110) is formed over the substrate followed by first polysilicon layer (120). First dielectric layer (110) is a floating gate oxide formed to a thickness between about 160 to 180 angstroms (Å). The preferred method of forming the gate oxide is by thermal oxidation in dry oxygen carried out in an oxidation furnace in a temperature range between about 750 to 950° C. Alternatively, other oxidation methods can be used, such as oxidation in a dry oxygen and anhydrous hydrogen chloride in an atmospheric or low pressure environment, or low temperature, high-pressure, and the like.

First polysilicon layer (120) is formed through methods including but not limited to Low Pressure Chemical. Vapor Deposition (LPCVD) methods, Chemical Vapor Deposition (CVD) methods and Physical Vapor Deposition (PVD) sputtering methods employing suitable silicon source materials, preferably formed through a LPCVD method employing silane SiH$_4$ as a silicon source material. The preferred thickness is between about 700 to 900 Å.

As a main feature and key aspect of the present invention, not one or two, but a multiplicity of floating gates comprising the first polysilicon layer, are next formed. This is accomplished by depositing a first photoresist layer (not shown) over the substrate, defining the floating gates and etching the first polysilicon layer accordingly to form a series of floating gates (120) as shown in both FIGS. 4b and 5b. It will be appreciated by those skilled in the art that forming floating gates as shown in the same Figures requires that the floating gates be separated apart by a certain amount of space between them. The spaces are openings (125) reaching floating gate oxide layer (110).

Figure 5B:
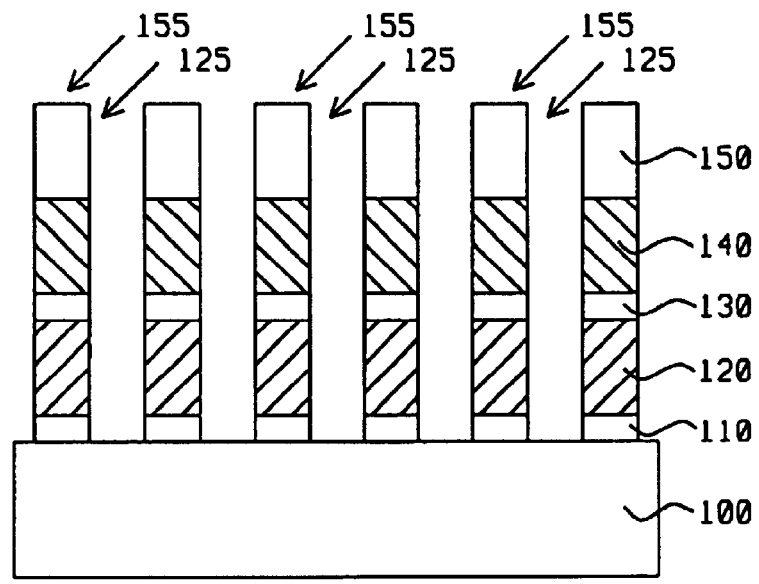

Next, a second dielectric layer is formed over the floating gate comprising an oxynitride film, or, ONO. Preferably, ONO film (130) shown in FIG. 5b comprises a bottom oxide layer with a thickness between about 70 to 80 Å, a middle layer of silicon nitride with a thickness between about 125 to 175 Å, and a top oxide layer with a thickness between about 25 to 35 Å. This oxynitride layer serves as an inter-gate layer between the floating gates and the control gates to be formed. A second polysilicon layer is formed next over the inter-gate oxide layer to form the control gates in a process similar to the forming of the floating gates. However, prior to defining the control gates, a third dielectric layer is formed over the second polysilicon layer. Third dielectric layer is preferably silicon nitride having a thickness between about 1400 to 1600 Å. Subsequently, control gates are defined on a second photoresist layer (not shown) and etching is performed to remove the photoresist layer, the underlying third polysilicon layer and the second and first polysilicon layer to reach the substrate surface through including opening (125) as shown in FIG. 5b. Thus, in both FIGS. 4b and 5b, numerals (140) refer to the control gates that have been formed over the second dielectric layer which covers the underlying floating gates. Numeral (150) refers to the third dielectric layer, or, silicon nitride layer. Again, it will be noted that the series of floating gates have over them a corresponding series of control gates, which together, form stacked gates (155) separated by openings (125) as shown in FIG. 5b. As is the case with the first photoresist layer, the second photoresist is also preferably removed first by oxygen plasma ashing process. The preferred thickness of the second polysilicon layer is between about 900 to 1100 Å, while the thickness of the third dielectric layer is between about 1400 to 1600 Å.

Figure 4C:
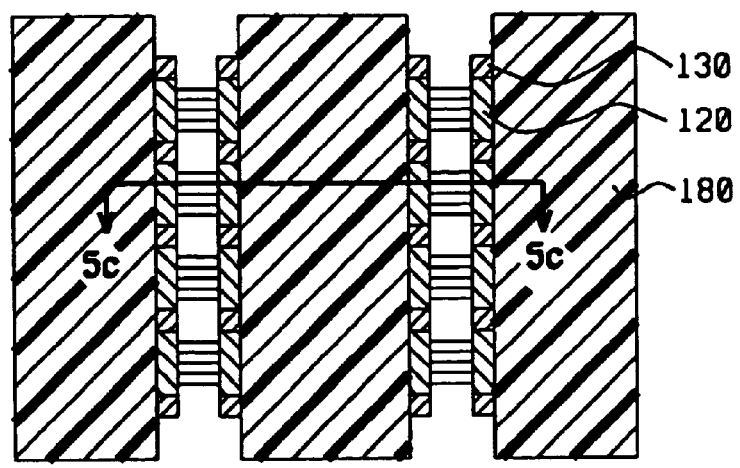
Figure 4D:
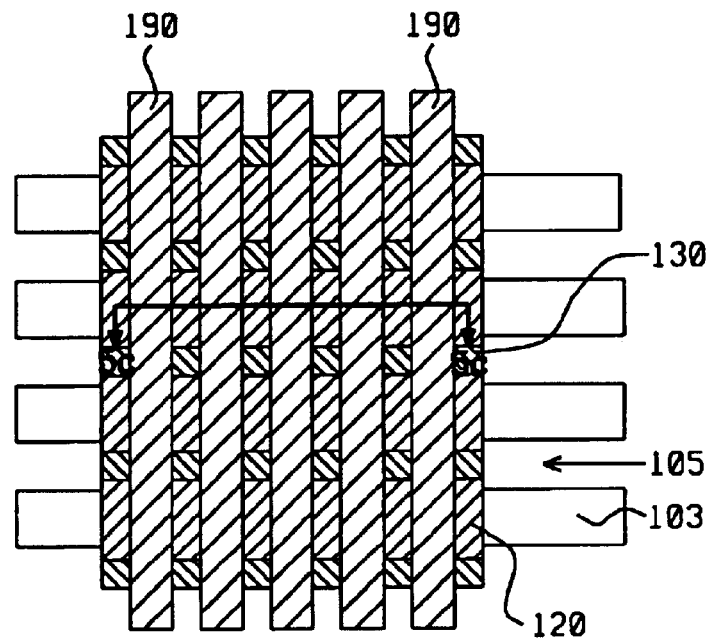
Figure 4E:
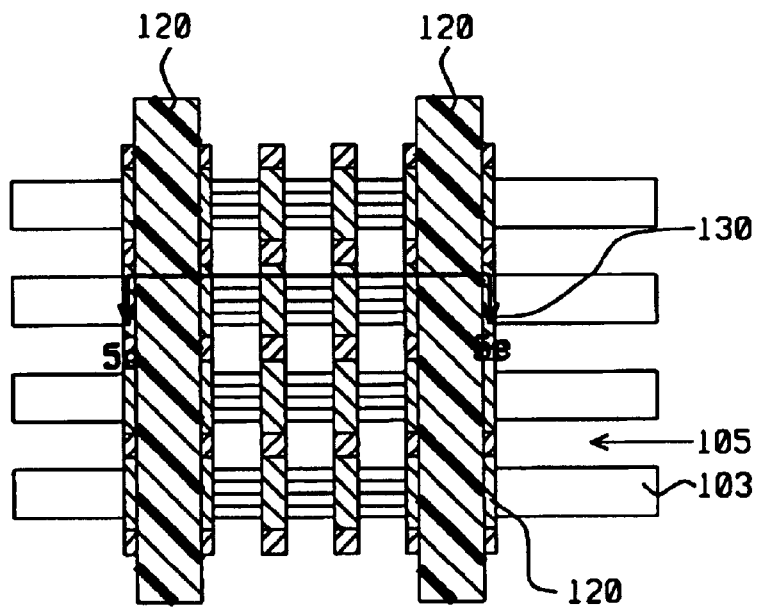
Figure 5C:
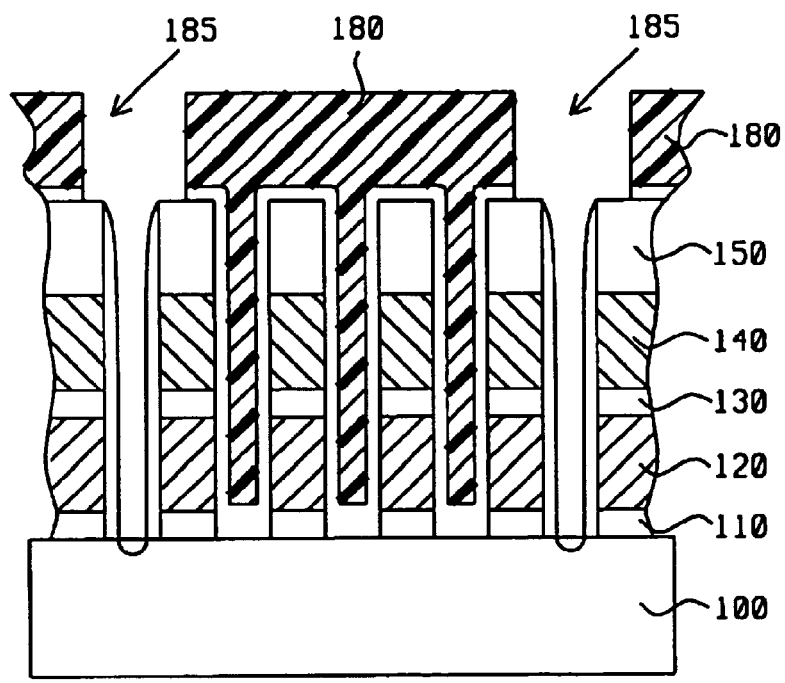

A fourth dielectric layer, reference numeral (160) in FIG. 5c, is next formed conformally over the substrate, including over the inside walls of openings (125). Preferably, the fourth dielectric layer is a high temperature oxide (HTO) formed at a temperature between about 750 and 850° C., and to a thickness between about 400 to 600 Å. Then a third photoresist, layer (180) in FIGS. 4c and 5c, is formed over the substrate, including over openings (125). Layer (180) is patterned to define source/drain (S/D) openings (185) just before the first and after the $N^{th}$ previously etched openings (125). Subsequently, the HTO layer over the inside walls, including the bottom wall of S/D openings (185) is anisotropically etched to form oxide spacers (170). It will be noted that S/D openings (185) shown in FIG. 5c reach the surface of substrate (100) of first conductivity type. A second implant is then performed in S/D regions (107) with a second conductivity type impurity, namely, arsenic (As) at an energy level between about 40 to 60 KeV and at a dosage level between about $3\times10^{14}$ to $1\times10^{16}$ atoms/cm$^2$. The third photoresist layer is then removed, using oxygen plasma ash techniques.

Figure 5D:
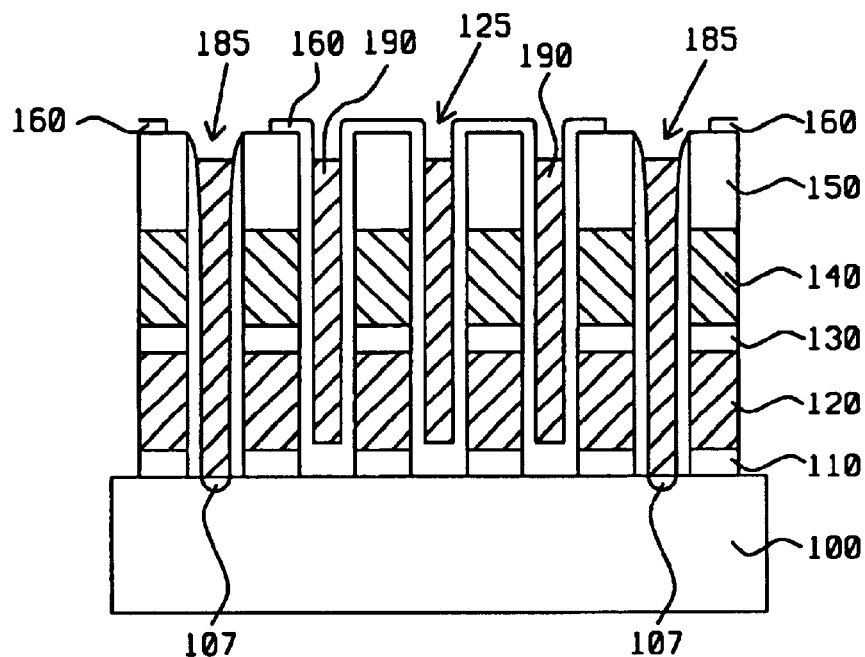
Figure 5E:
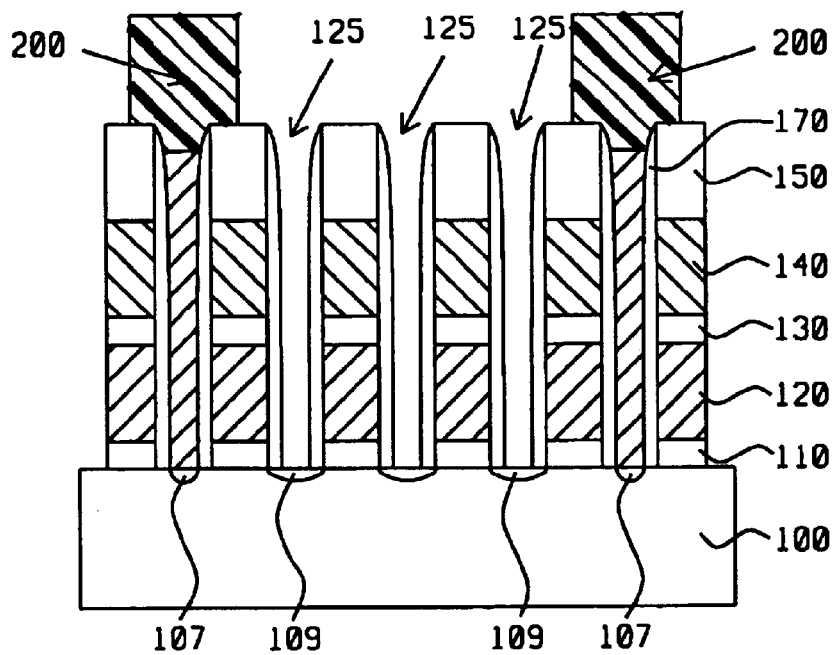

Next, third polysilicon layer (190) is formed over the substrate, including over openings (125) and (185) to a thickness between about 1400 to 1600 Å. Third polysilicon layer is in situ doped to act as conductive pick-up bit lines over S/D regions (107) and etched back as shown in FIG. 5d. Third polysilicon layer in openings (125) is then removed after providing a fourth photoresist layer (200) as a protection over openings (185) as seen both in FIGS. 4e and 5e.

Figure 4F:
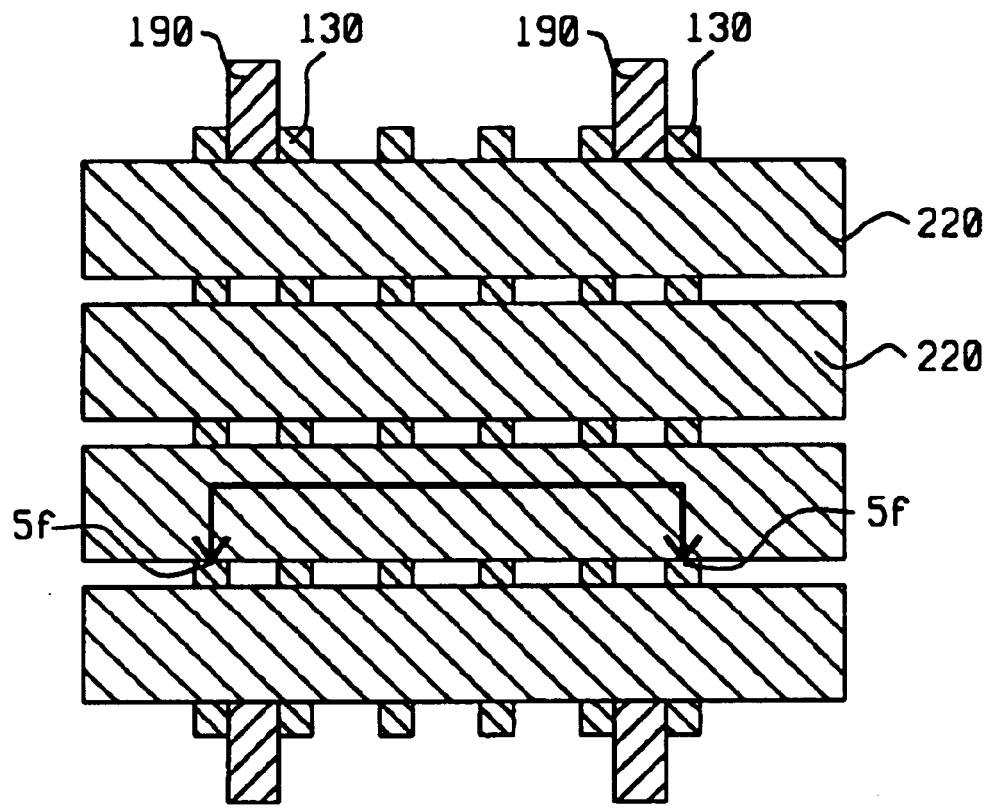
Figure 5F:
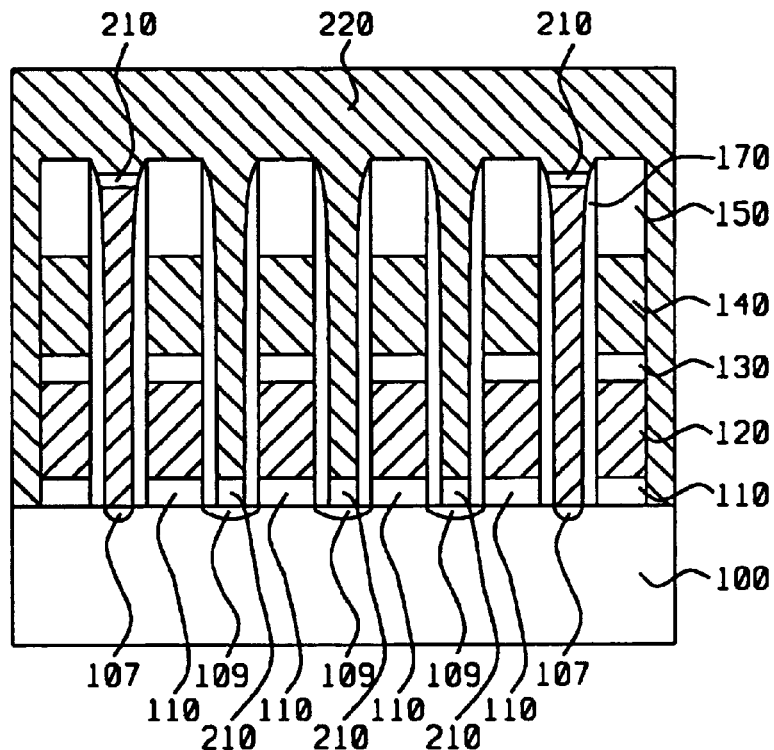

The removal of the third polysilicon layer from openings (125) is accomplished by etching which reaches floating gate oxide layer (110) at the bottom of openings (125). The substrate is then implanted through openings (125) to a threshold voltage Vt utilizing boron fluoride (BF$_2$) ions at a concentration of $5\times10^{12}$ to $5\times10^{13}$ atoms/cm$^2$ and at an energy level between about 40 to 60 KeV, where diffusion regions (109) are self-aligned to adjacent stacked gates (155) containing floating gates and control gates. The ion damaged gate oxide layer (110) in opening (125) is then etched away, third photoresist layer (200) removed and a fifth dielectric, layer (210) is formed over the substrate including over bit lines (185) and over substrate (100) exposed at the bottom of openings (125) as shown in FIG. 5f. Fifth dielectric layer (210), with a preferred thickness between about 150 to 250 Å serves as a select gate oxide for the select gates to be formed in openings (125) and as an insulation between bit lines (185) and a word line to be formed as follows:

A fourth polysilicon, layer (220) in FIGS. 4f and 5f, is next formed over the substrate including over openings (125) and bit lines (185) to a preferred thickness between about 1400 to 1600 Å. Then a fourth photoresist layer is patterned (not shown) to define select gates and the fourth polysilicon layer is etched accordingly as can be better seen in the top view of a portion of substrate (100) in FIG. 4f. Thus the fourth polysilicon layer serves as a word line which is oriented normal, that is, perpendicular to the first and second bit lines. The photoresist layer is then removed, and hence, the forming of a multi-bit split-gate (MSG) flash cell with multi-shared source/drain of this invention is completed, comprising N+1 stacked gates (155) separated by N select gates (125), where N is any integer.

It will be apparent to those skilled in the art that the disclosed MSG of FIGS. 4f and 5f make possible the sharing of the pair of S/D regions (107) with a multiplicity of stacked gates (155) associated with select gates (125). Hence, it will now be apparent also that, unlike with prior art where at most two bits or cells may be formed between two bit lines and along a word line, a plurality of bits or cells that exceed two may be formed between the two bit lines and along the same word line. In fact N+1 bits may be formed where there are N'=N+1 stacked gates containing floating gates and control gates, separated by N select gates, it will be recalled.

Figure 6A:
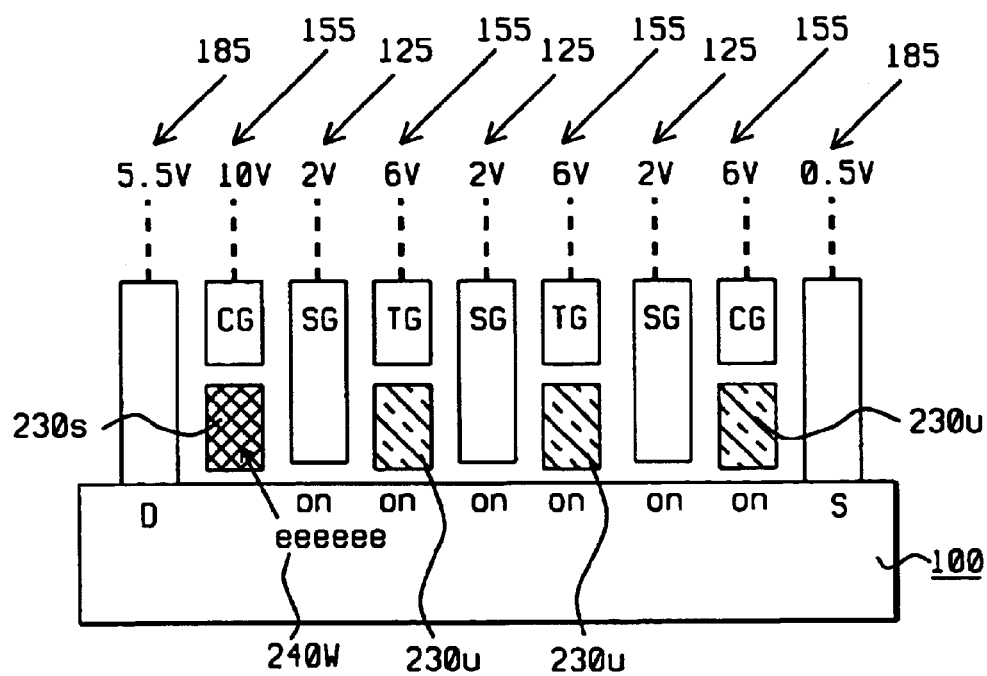
FIG. 6a is a schematic drawing showing the structural state of an MSG flash memory cell after programming (writing) operation, according to the present invention.
Figure 6B:
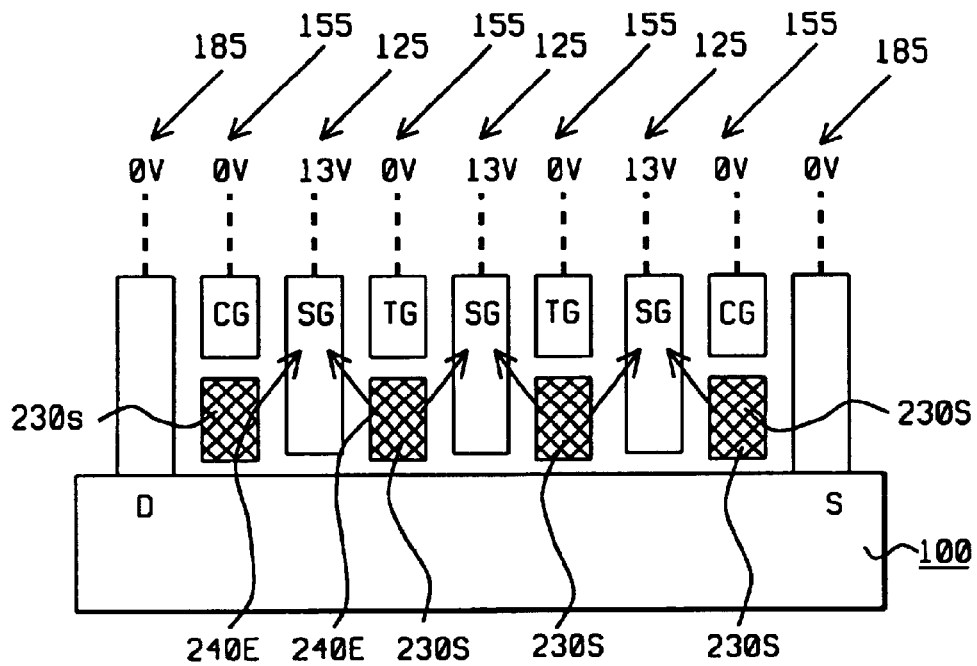
FIG. 6b is a schematic drawing showing the structural state of an MSG flash memory cell after erase operation, according to the present invention.
Figure 6C:
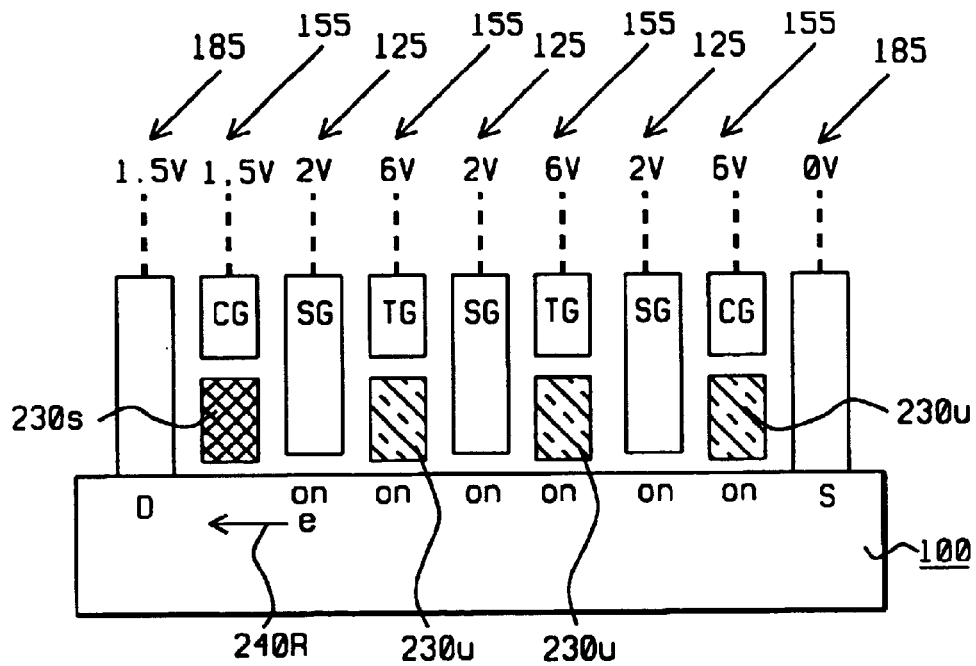
FIG. 6c is a schematic drawing showing the structural state of an MSG flash memory cell after read operation, according to the present invention.
Figure 7A:
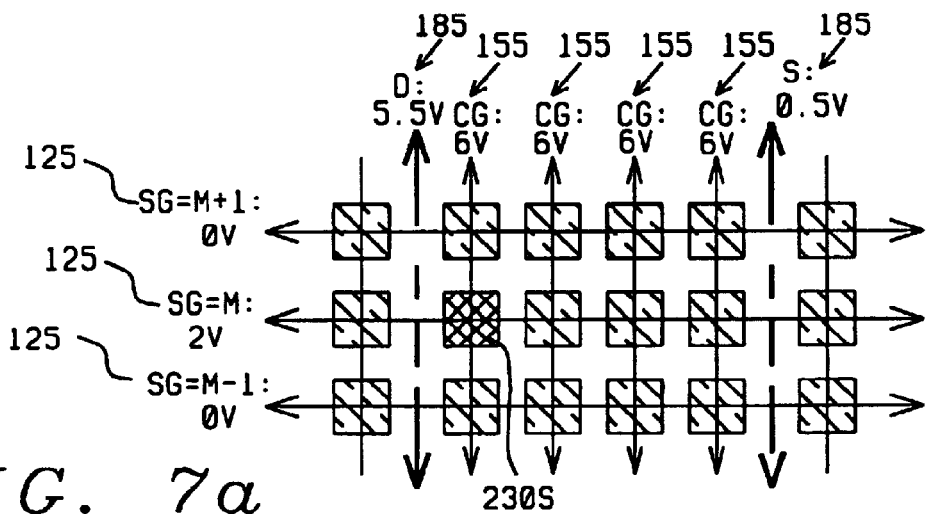
FIG. 7a is a schematic drawing showing the diagrammatic plan view of FIG. 6a, according to the present invention.
Figure 7B:
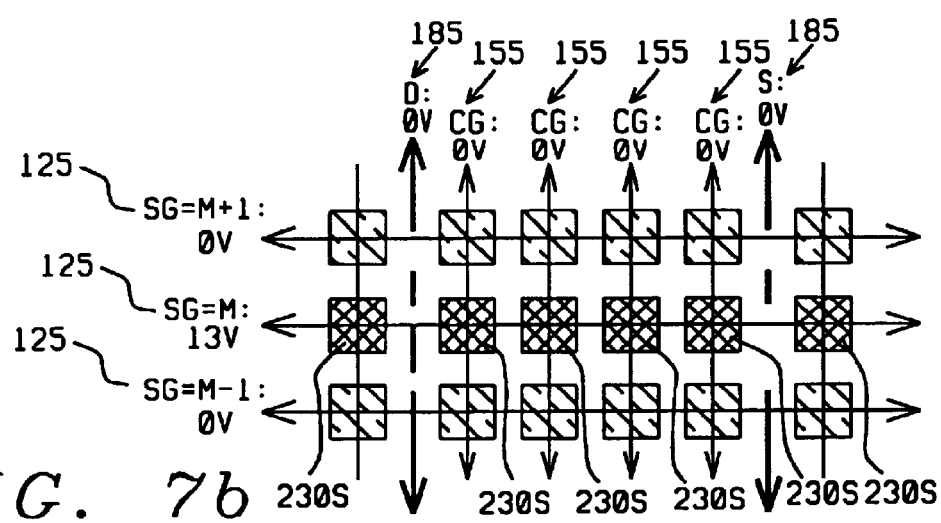
FIG. 7b is a schematic drawing showing the diagrammatic plan view of FIG. 6b, according to the present invention.
Figure 7C:
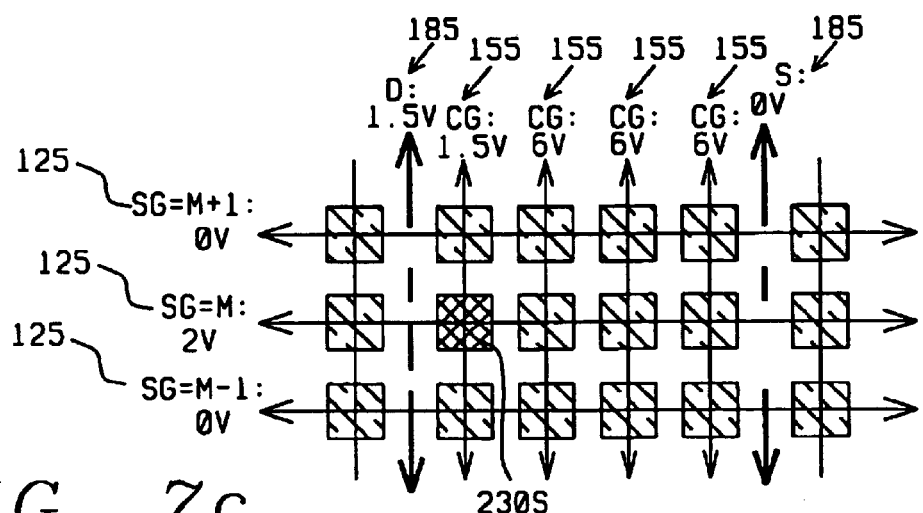
FIG. 7c is a schematic drawing showing the diagrammatic plan view of FIG. 6c, according to the present invention.

Thus in FIGS. 6a-6c, a programming method is shown for writing, erasing and reading a multiplicity of bits for the MSG of this invention. (Although the word "programming" is sometimes used to signify "writing" operation, it is used here in the larger sense incorporating writing, erasing and reading operations.) FIGS. 6a-6c schematically represent the cross-sectional views of a MSG while FIGS. 7a-7c represent a diagrammatic plan view of the same MSG where Figure numbers with the suffixes (a), (b) and (c) refer to the write, erase and read operations, respectively. The key shown in FIG. 1c also apply to FIGS. 6a-6c and 7a-7c.

For purposes of illustrating the disclosed multi-bit programming, 4 bits along a word line on substrate (100) are shown in FIGS. 6a-6c and 7a-7c. It will be apparent from FIGS. 6a-6c that there are N=3 select gates (SGs) (125) and N+1=4 stacked gates (155). In other words, there are N+1=4 bits shown in FIGS. 6a-6c and 7a-7c. It will also be apparent that one can select any N SGs and the corresponding N+1=N' bits to be programmed. Keeping the same reference numerals in FIGS. 4a-4f or 5a-5f referring to similar parts throughout the several views in FIGS. 6a-6c and 7a-7c as well, the S/D bit lines are referred to by numeral (185), the stacked gates by numeral (155) and select gates by numeral (125).

FIGS. 6a and 7a show the write operation for the disclosed MSG. The write operation is performed bit by bit and the write bit is selected not only by bit line (185), word line (220) connected to SG, select gate (125), but also by CG, control gate (155), as a main feature and key aspect of the invention. The extra CG selection enables the capability of performing write operation with more bits than just two bits along a word line between a pair of S/D bit lines. Thus, it will be apparent to those skilled in the art that through this extra CG selection feature of the invention, the density of the memory array can be increased. It will also be noted that the address of CG and transfer gate TG can be exchanged, depending upon which bit needs to be programmed, i.e., written, within a pair of bit lines. For this operation, CG voltage $V_{CG}$ is always larger than TG voltage, $V_{TG}$ to provide sufficient vertical electric field for write operation, as is shown in FIGS. 6a and 7a. The other TGs between the two bit lines are used to turn on the substrate channel below un-selected bits with lower voltage. Select gates SG are also used to turn on the substrate channel below SG during programming, or write operation.

Thus, in the write operation of FIGS. 6a and 7a, source-side-injection mechanism is used where the selected gate (SG) is only weakly turned on so as to just turn on channel of unselected cell (230u) while a higher voltage is used on control gate (CG) to provide higher vertical electric field to complete the write operation. In other words, hot-electrons (240W) are created at the transitional channel region between SG and CG, and injected to the source side of the floating gate (230s) while TG and CG are strongly turned on. Thus, under these conditions, hot electrons will inject into the floating gate under CG, but will not inject into the floating gate under TG due to higher voltage of CG to enable programming, while lower voltage of TG just turning the channel on. This difference in the application of voltage for CG and TG gives a choice of which cell to be programmed between source and drain of the multi-bit split gate (MSG) flash of the invention. The various voltage levels are shown for the program operation in both FIGS. 6a and 7a.

In the erase operation shown in FIGS. 6b and 7b, Fowler-Nordheim tunneling from poly-to-poly (240E) is used and erased bits are selected only by word line connected to select gates (SGs). As seen in FIG. 6b, erased bits (230s) are selected only by CG and a whole page of bits in the array are erased. It is also noted that after erase, positron charges are present in the floating gates. In this manner, when high voltage is forced on the word line of the SGs, electrons will inject from the floating gate to SGs resulting from the creation of high electric field between the corner tip of the floating gate and the select gates, SGs.

The read operation shown in FIGS. 6c and 7c is accomplished by selecting the read bits by word line connected to select gates (125) and bit lines (185) as in the write operation except that the TG and SG are fully turned on and the stored information is sensed by detecting whether there is channel current (240R) under the grounded CG. A higher level of current indicates that the channel is fully turned on, while a lower current signifies that the channel is turned off (although other parts of the channel are turned on) where a lower voltage is impressed on the CG of the selected cell and higher voltage on the TG of the unselected cell. In this condition, the selected cell is in the programming state so that the selected gate can be addressed for the MSG.

Thus, the following table summarizes the various voltage levels that are impressed on the terminals of an MSG of the present invention where there are N select gates, N'=N+1 stacked gates between two bit lines BL1 and BL2 with 4 bits, where N=3:

TABLE I

| Voltage | Write | Erase | Read |
|---|---|---|---|
| $V_{SG}$ | 2 | 13 | 2 |
| $V_{CG}$ | 10 | 0 | 1.5 |
| $V_{TG}$ | 6 | 0 | 6 |
| $V_{BL1}$ | 5.5 | 0 | 1.5 |
| $V_{BL2}$ | 0.5 | 0 | 0 |

This should be compared with only the two bits that can be programmed in prior art FIGS. 2a-2c and 3a-3c. Though numerous details of the disclosed method are set forth here to provide an understanding of the present invention, it will be obvious, however, to those skilled in the art that these specific details need not be employed to practice the present invention. At the same time, it will be evident that the same methods may be employed in other similar process steps that are too many to cite, such as, for example in saliciding the word line or in the programming (writing), erasing and reading N'=N+1 bits, where N is any integer, in the manner disclosed above.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a multi-bit flash cell comprising the steps of:

providing a semiconductor substrate having active and passive regions defined;

forming a first dielectric layer over said substrate;

forming a first polysilicon layer over said first dielectric layer;

forming a plurality of floating gates comprising said first polysilicon layer, wherein said plurality of floating gates are spaced apart by a plurality of openings over said first dielectric layer;

forming a second dielectric layer over said plurality of floating gates, including said plurality of openings;

forming a second polysilicon layer over said second dielectric layer;

forming a plurality of control gates comprising said second polysilicon layer over said second dielectric layer over said plurality of floating gates;

forming a third dielectric layer over said plurality of control gates;

forming a fourth dielectric layer over the inside walls of said plurality of openings;

forming a third polysilicon layer over first of said plurality of openings to form a first bit line over said substrate, and over last of said plurality of openings to form a second bit line over said substrate;

forming a fifth dielectric layer over said first bit line and over said second bit line; and forming a fourth polysilicon layer over said fifth dielectric layer, including over said plurality of openings, to form a word line contacting select gates on said semiconductor substrate.

2. The method according to claim 1, wherein said first dielectric layer is a floating gate oxide having a thickness between about 160 to 180 Å.

3. The method according to claim 1, wherein said first polysilicon layer has a thickness between about 700 to 900 Å.

4. The method according to claim 1, wherein said second dielectric layer is inter-gate oxide having a thickness between about 70 to 80 Å.

5. The method according to claim 1, wherein said second polysilicon layer has a thickness between about 900 to 1100 Å.

6. The method according to claim 1, wherein said third dielectric layer is silicon nitride having a thickness between about 1400 to 1600 Å.

7. The method according to claim 1, wherein said fourth dielectric layer is an oxide spacer comprising a high temperature oxide having a thickness between about 400 to 600 Å.

8. The method according to claim 1, wherein said third polysilicon layer has a thickness between about 1400 to 1600 Å.

9. The method according to claim 1, wherein said fifth dielectric layer is select gate oxide having a thickness between about 150–250 Å.

10. The method according to claim 1, wherein said fourth polysilicon layer has a thickness between about 1400 to 1600 Å.

* * * * *